United States Patent
Heimann et al.

(10) Patent No.: US 9,466,446 B2
(45) Date of Patent: Oct. 11, 2016

(54) ROTARY KNOB OPERATOR CONTROL APPARATUS AND DOMESTIC APPLIANCE HAVING AT LEAST ONE ROTARY KNOB OPERATOR CONTROL APPARATUS

(71) Applicant: DIEHL AKO STIFTUNG & CO KG, Wangen (DE)

(72) Inventors: Uwe Heimann, Wangen (DE); Michael Prinz, Leutkirch (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 338 days.

(21) Appl. No.: 13/947,356

(22) Filed: Jul. 22, 2013

(65) Prior Publication Data

US 2014/0021024 A1    Jan. 23, 2014

(30) Foreign Application Priority Data

Jul. 21, 2012   (DE) .................. 10 2012 014 535

(51) Int. Cl.
*H01H 9/00*      (2006.01)
*H01H 25/06*    (2006.01)
(Continued)

(52) U.S. Cl.
CPC .............. *H01H 25/06* (2013.01); *G05G 5/065* (2013.01); *H01H 19/11* (2013.01); *H01H 25/065* (2013.01); *H03K 17/98* (2013.01); *G05G 1/08* (2013.01); *H03K 2217/94073* (2013.01)

(58) Field of Classification Search
CPC ............ H01H 1/00; H01H 1/06; H01H 3/00; H01H 3/02; H01H 3/08; H01H 3/54; H01H 13/00; H01H 13/14; H01H 13/22; H01H 13/26; H01H 13/50; H01H 2003/02; H01H 2003/12; H01H 2201/004; H01H 2205/00; H01H 2205/002; H01H 2205/004; H01H 2221/01; H01H 2223/01; H01H 2223/012; H01H 2223/028; H01H 2231/012; H01H 2231/016; H01H 9/00; H01H 19/02; H01H 2003/0293; H01H 2239/066; H03K 17/962; H03K 17/975; H03K 2217/94073; H03K 2217/96066
USPC .......... 200/4, 11 R, 5 E, 13, 14, 11 C, 19.07, 200/19.08, 19.18, 296, 336, 16 R, 345, 520, 200/565; 400/490, 491.2, 495.1
See application file for complete search history.

(56) References Cited

U.S. PATENT DOCUMENTS 4,082,925 A * 4/1978 Hufford ............... H01H 19/115
                                                              200/11 G
5,920,131 A   7/1999 Platt et al.
(Continued)

FOREIGN PATENT DOCUMENTS

DE      10218294 A1    11/2003
DE      10255676 A1     6/2004
(Continued)

*Primary Examiner* — Renee S Luebke
*Assistant Examiner* — Anthony R. Jimenez
(74) *Attorney, Agent, or Firm* — Laurence A. Greenberg; Werner H. Stemer; Ralph E. Locher

(57) ABSTRACT

A rotary knob operator control apparatus for an electrical domestic appliance has a mounting board on a side of an operator control panel facing away from a user, a first electrode configuration on the mounting board and a substantially annular operator control element on a side of the operator control panel facing toward the user. The operator control element has a second electrode configuration and a holding device for the operator control element on the operator control panel. The operator control element rotates about an axis perpendicular to the operator control panel. The operator control element is latched relative to the operator control panel in predefined rotary positions by a latching device, so the second electrode configuration on the operator control element is oriented in a predefined manner relative to the first electrode configuration. An electrical domestic appliance having at least one rotary knob operator control apparatus is also provided.

12 Claims, 9 Drawing Sheets

(51) Int. Cl.
*G05G 5/06* (2006.01)
*H03K 17/98* (2006.01)
*H01H 19/11* (2006.01)
*G05G 1/08* (2006.01)

(56) References Cited

U.S. PATENT DOCUMENTS

| | | | |
|---|---|---|---|
| 6,294,906 B1 | 9/2001 | Kuechler | |
| 7,355,135 B2* | 4/2008 | Rainer et al. | 200/296 |
| 7,642,673 B2 | 1/2010 | Baier | |
| 7,767,916 B2* | 8/2010 | Kurihara | B60K 37/06 200/38 R |
| 7,926,964 B2* | 4/2011 | Claprood | 362/23.04 |
| 8,294,049 B2* | 10/2012 | Tsuduki | 200/5 R |
| 2007/0181410 A1* | 8/2007 | Baier | 200/17 R |
| 2013/0032456 A1* | 2/2013 | Nakajima et al. | 200/336 |

FOREIGN PATENT DOCUMENTS

| | | |
|---|---|---|
| DE | 102004013947 B3 | 12/2005 |
| DE | 102005049995 A1 | 4/2007 |
| DE | 102006057311 A1 | 5/2008 |
| DE | 102008045232 A1 | 3/2010 |
| EP | 0797227 B1 | 11/2003 |
| EP | 1045300 B1 | 8/2004 |
| WO | WO 2011104793 A1 * | 9/2011 |

* cited by examiner

ROTARY KNOB OPERATOR CONTROL APPARATUS AND DOMESTIC APPLIANCE HAVING AT LEAST ONE ROTARY KNOB OPERATOR CONTROL APPARATUS

CROSS-REFERENCE TO RELATED APPLICATION

This application claims the priority, under 35 U.S.C. §119, of German Patent Application DE 10 2012 014 535.7, filed Jul. 21, 2012; the prior application is herewith incorporated by reference in its entirety.

BACKGROUND OF THE INVENTION

1 Field of the Invention

The present invention relates to a rotary knob operator control apparatus, in particular for an electrical domestic appliance. The invention also relates to a domestic appliance having at least one rotary knob operator control apparatus.

In electrical domestic appliances such as cooktops, ovens, washing machines, dishwashers and the like, it is desirable to construct the operator control panel to be as closed as possible, that is to say without through-holes and the like. Therefore, touch-sensitive or proximity-sensitive operator control elements, which are provided with an optical, inductive, capacitive or magnetic sensor configuration, are often used instead of pushbuttons and push-switches.

Rotary knobs previously exhibited an operator control element which was rotatably mounted on a switch shaft, wherein the switch shaft was routed through a through-hole in the operator control panel. In order to be able to retain a closed operator control panel even when using rotary knobs, German Patent Application DE 102 18 294 A1, German Patent DE 10 2004 013 947 B3 and European Patent EP 0 797 227 B1 disclose operator control elements which are magnetically held on the operator control panel. The rotary position or rotary movement of the operator control elements is detected by optically, inductively, capacitively or magnetically detecting sensor configurations in those cases. European Patent EP 1 045 300 B1, corresponding to U.S. Pat. No. 6,294,906, discloses a rotary knob operator control apparatus in which the operator control element is plug-mounted onto a plastic support which is adhesively bonded onto the closed operator control panel.

SUMMARY OF THE INVENTION

It is accordingly an object of the invention to provide an improved rotary knob operator control apparatus and a domestic appliance having at least one rotary knob operator control apparatus, which overcome the hereinafore-mentioned disadvantages of the heretofore-known apparatuses and appliances of this general type, which permit the use of a closed operator control panel and which provide improved operator control by a user.

With the foregoing and other objects in view there is provided, in accordance with the invention, a rotary knob operator control apparatus, comprising a mounting board on a side of an operator control panel averted from a user, a first electrode configuration on the mounting board, a substantially annular operator control element on a side of the operator control panel facing the user, a second electrode configuration on the operator control element, a holding device for holding the operator control element on the operator control panel, the operator control element being rotatable about a rotation axis running substantially perpendicular to the operator control panel, and a latching device for latching the operator control element relative to the operator control panel in a plurality of predefined rotary positions.

The first electrode configuration on the mounting board, preferably a printed circuit board, and the second electrode configuration on the operator control element together form a capacitive sensor configuration for detecting the rotary position or rotary movement of the operator control element relative to the operator control panel. By virtue of this capacitive sensor configuration, it is possible to construct the operator control panel to be closed, that is to say for example without apertures, and therefore water-tight in the region of the rotary knob operator control apparatus too. This simplifies production of the operator control panel, facilitates cleaning of the operator control panel, protects the components which are disposed behind the operator control panel against dirt and moisture and prevents contact which results in wear. If further operator control apparatuses of the electrical domestic appliance are constructed as touch-sensitive or proximity-sensitive operator control apparatuses, in particular with capacitive sensor configurations, for the rotary knob operator control apparatus and the further operator control apparatuses of one mounting board or printed circuit board, a uniform detection and evaluation concept can therefore be realized. This simplifies production of the operator control apparatuses.

The annular operator control element, which is held on the operator control panel in a rotatable manner, can be operated by the user of the domestic appliance in a simple and intuitive manner. The operator control element has a substantially annular cross-sectional shape perpendicular to the rotation axis. The annular cross-sectional shape is preferably, but not necessarily, substantially rotationally symmetrical (for example in the form of a ring). Furthermore, the operator control element also has an extent in the direction parallel to the rotation axis, and therefore it can also be called sleeve-like, bushing-like or tubular. The operator control element is preferably constructed at least partially as a hollow body. The operator control element is preferably provided with an optical and/or haptic marking which indicates to the user the current absolute rotary position of the operator control element relative to the operator control panel.

The operator control apparatus according to the invention is additionally provided with a latching device for latching the operator control element relative to the operator control panel in a plurality of, that is to say at least two, predefined rotary positions. In these predefined rotary positions of the operator control element relative to the operator control panel, the second electrode configuration on the operator control element is, at the same time, located in predefined rotary positions relative to the first electrode configuration on the mounting board. This simplifies evaluation of measurement signals from the capacitive sensor configuration and thereby increases the accuracy of the input by the operator control element.

The latching apparatus can additionally effect haptic feedback to the user when turning the operator control element. Input is thereby improved and simplified for the user.

The first electrode configuration and the second electrode configuration, together with the operator control panel, which forms a dielectric, between them, form a capacitor. When a finger of the user approaches or touches the electrically conductive operator control element, the capacitance value of the capacitor changes, with it being possible for this change to be detected and evaluated by a suitable evaluation circuit which is connected to the first electrode configuration. Measurement signals which are generated by the evaluation circuit are then forwarded to a control system of the domestic appliance. The evaluation circuit can selectively be integrated in the control system. In order for the operator control panel to function as a dielectric, it is preferably constructed to be substantially electrically insulating, at least in the region of the operator control element. An absolute rotary position of the operator control element, a change in rotary position of the operator control element and/or a rotation direction of the operator control element can be detected and evaluated in this connection.

Furthermore, the capacitance value of the capacitor also depends on the positioning of the second electrode configuration relative to the first electrode configuration. Whereas the first electrode configuration on the mounting board preferably has a plurality of, that is to say two, three, four up to ten, eleven, twelve and more, electrodes disposed next to one another, the second electrode configuration on the operator control element preferably has only a few, in particular only one or two, electrodes. In the rotary positions of the operator control element which are predefined by the latching device, one electrode of the second electrode configuration on the operator control element preferably substantially overlaps one or more electrodes of the first electrode configuration on the mounting board, and the evaluation circuit can detect which of the plurality of electrodes of the first electrode configuration it is in each case. In order to improve the evaluation and therefore the accuracy of the inputs by the operator control element, the first and the second electrode configuration are each preferably disposed as close as possible to the operator control panel or even so as to be in contact with the operator control panel.

In a preferred refinement of the invention, the first electrode configuration has a plurality of electrode segments on the mounting board, the electrode segments being disposed substantially coaxially to the rotation axis of the operator control element and/or the second electrode configuration on the operator control element has at least one electrode which extends substantially radially to the rotation axis of the operator control element.

The holding device is constructed to hold the annular operator control element on the operator control panel, preferably in the radial direction and in the axial direction. In this case, the holding device is constructed in such a way that the operator control element can be rotated about a rotation axis which runs substantially perpendicular to the operator control panel, preferably through at least 90°, more preferably through at least 180°, even more preferably through 360°. The holding device is preferably constructed in such a way that the operator control panel itself can remain with a closed construction. The holding device is preferably fitted or integrally formed on the operator control panel on that side which faces the user, preferably in the form of a holding pin which is constructed and oriented substantially coaxially to the rotation axis of the operator control element.

In a preferred refinement of the invention, the operator control element is held in a detachable manner on the operator control panel by the holding device. In this way, the operator control element can be removed from the operator control panel as required, with the result that the operator control element and the operator control panel can be easily cleaned.

The latching device is constructed to latch the operator control element relative to the operator control panel in a plurality of predefined rotary positions. In this case, the latching effect is preferably set in such a way that, on one hand, it can be easily overcome by the user in order to rotate the operator control element further, but on the other hand can also be sensed by the user.

The latching of the operator control element relative to the operator control panel, which latching is effected by the latching device, is preferably performed in a substantially radial manner, that is to say in a plane substantially perpendicular to the rotation axis of the operator control element, or in a substantially axial manner, that is to say substantially parallel to the rotation axis of the operator control element. The latching device is preferably constructed in such a way that it effects latching between the operator control element and the operator control panel itself or between the operator control element and the holding device.

The rotary knob operator control apparatus can preferably be used in electrical domestic appliances, for example cooktops, ovens, washing machines, tumble dryers, dishwashers and the like. The rotary knob operator control apparatus can be used, for example, to input a cooking or heating stage, a washing program, a drying program, etc.

In a preferred refinement of the invention, the latching device has at least one elastic or elastically mounted latching element. The latching device preferably has at least one spring.

In a further preferred refinement of the invention, the first electrode configuration on the mounting board (additionally) has a central electrode, and a pushbutton is disposed in the operator control element substantially coaxially to the rotation axis of the operator control element, can be moved substantially in the direction of the rotation axis of the operator control element, and has at least one electrode on its side which faces the operator control panel. The central electrode of the first electrode configuration on the mounting board, together with the electrode on the pushbutton and the operator control panel, which acts as a dielectric, between them, forms a capacitor, with the capacitance value of the capacitor depending, amongst other things, on the distance between the electrodes, which distance can be changed by operating the pushbutton. This integrated pushbutton can, for example, allow input of an additional function (for example as a main switch for switching on and switching off a cooktop or the appliance). The pushbutton is preferably constructed in such a way that it provides haptic feedback when it is operated. The pushbutton is held, for example, on the holding device selectively so as to rotate together with the operator control element about the rotation axis of the operator control element or in such a way that it is fixed in terms of rotation.

In yet a further preferred refinement of the invention, at least one light source is disposed on the mounting board, the operator control panel is constructed to be at least partially transparent, and the operator control element is constructed to be at least partially transparent and/or contain at least one light guide element. In this refinement of the rotary knob operator control apparatus, the operator control element can be backlit and as a result indicate, for example, an operating state of the domestic appliance, of an associated cooktop, etc.

With the objects of the invention in view, there is also provided an electrical domestic appliance, comprising at least one rotary knob operator control apparatus according to the invention. The electrical domestic appliance is preferably a washing machine, a tumble dryer, a dishwasher, an oven, a cooktop, a microwave oven or the like.

In accordance with a concomitant feature of the invention, at least one touch-sensitive or proximity-sensitive operator control element is additionally provided with a capacitive sensor configuration, and an electrode of the capacitive sensor element is provided on the same mounting board as the first electrode configuration of the rotary knob operator control apparatus.

Other features which are considered as characteristic for the invention are set forth in the appended claims.

Although the invention is illustrated and described herein as embodied in a rotary knob operator control apparatus and a domestic appliance having at least one rotary knob operator control apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
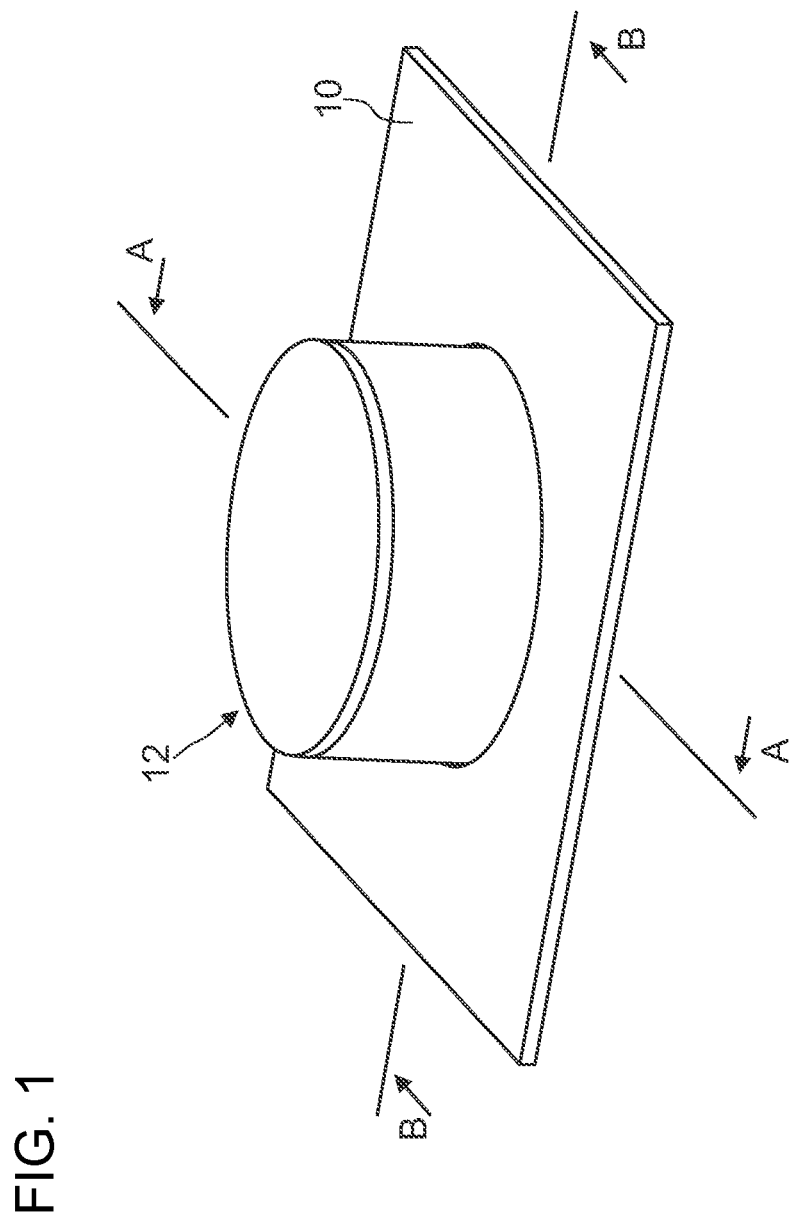
FIG. 1 is a diagrammatic, perspective plan view of a rotary knob operator control apparatus according to a first exemplary embodiment of the present invention.
Figure 2:
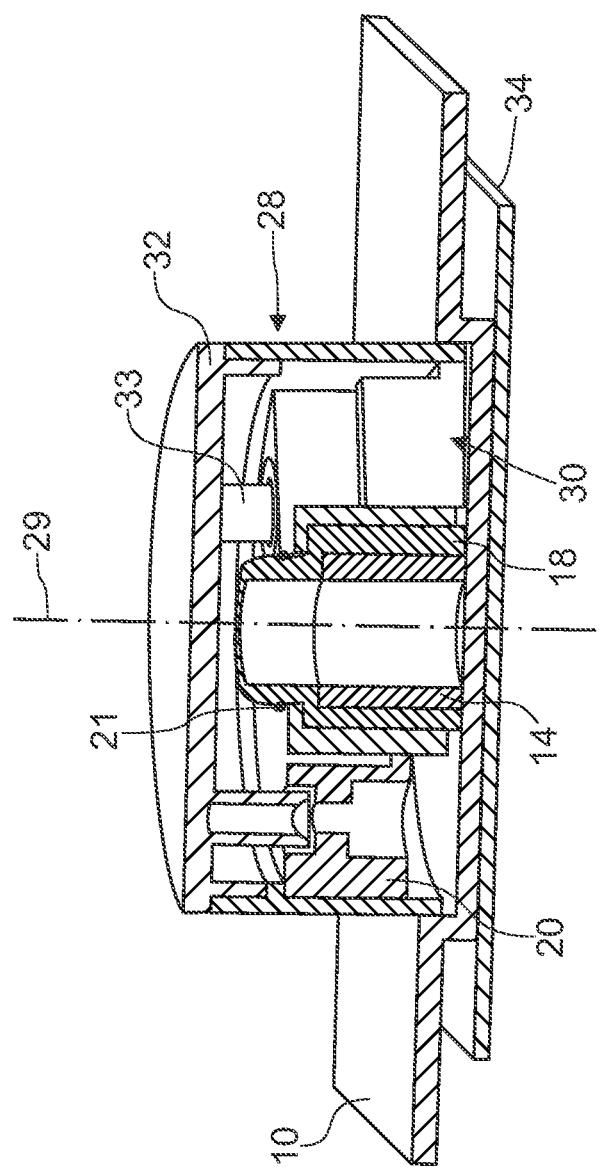
FIG. 2 is a sectional view of the rotary knob operator control apparatus of FIG. 1, which is taken along a section line A-A thereof, in the direction of the arrows.

Referring now to the figures of the drawings in detail and first, particularly, to FIGS. 1-5 thereof, there is seen a first exemplary embodiment of a rotary knob operator control apparatus according to the invention. The invention will be described by using the example of a washing machine in this case.

A rotary knob operator control apparatus 12 is provided on an operator control panel 10 of a washing machine. It is possible, for example, for a large number of different washing and spin-drying programs of the washing machine to be set by using the rotary knob operator control apparatus.

A sleeve-like holding pin 14 is integrally formed on or fastened to that side of the operator control panel 10 which faces the user (at the top in the figures). The sleeve-like holding pin forms a holding device of the rotary knob operator control apparatus 12 according to the invention. The longitudinal axis of this holding pin 14 is coaxial to the rotation axis 29 of an operator control element 28 which is described below.

A circular depression 16 is also formed around this holding pin 14 in that side of the operator control panel 10 which faces the user. This depression 16 serves as a positive guide for the operator control element 28 which is described below. The depression 16 is preferably constructed in such a way that water and dirt can be easily removed from it or can flow out of it by themselves.

A sleeve-like latching bushing 18 is placed on the holding pin 14. The latching bushing 18 is connected to the holding pin 14, for example by press-fitting, latching, adhesive bonding, welding or the like, so as to rotate with it. In this exemplary embodiment, the latching bushing 18 also has approximately the same height as the holding pin 14, with the result that the ends of the latching bushing 18 and the holding pin 14 which face the user are oriented substantially in alignment with one another.

A plurality of latching depressions 19 are formed on an outer casing surface of the latching bushing 18. The latching depressions are separated from one another by ribs (see, in particular, FIG. 4). The latching depressions 19 and the ribs run substantially parallel to one another and parallel to the rotation axis 29 of the operator control element 28. In this exemplary embodiment, the latching depressions 19 also run over the entire height of the latching bushing 18, but they can selectively also extend only over a predetermined portion of the height in each case.

As an alternative, the latching bushing 18 can also be formed integrally or in one piece with the holding pin 14. In this case, the latching depressions 19 are formed directly on the outer casing surface of the holding pin 14.

A guide body 20 is then mounted on the holding pin 14 having the latching bushing 18. The guide body 20 has a central recess and the inside diameter of this central recess is somewhat larger than the outside diameter of the latching bushing 18, with the result that the guide body 20 can be rotated relative to the latching bushing 18 which is seated on the holding pin 14. The guide body 20 is additionally held in a detachable manner on the holding pin 14 or the latching bushing 18 in the axial direction by a spring ring which engages in an outer circumferential groove 22 in the latching bushing 18.

The guide body 20 is substantially in the form of a circular disc. At least one receptacle 23 which extends in the radial direction is formed in the guide body 20 (in this exemplary embodiment, two receptacles 23 are situated diametrically opposite one another). The receptacles 23 are constructed as holes which extend in the radial direction completely through the guide body from the outer circumference to the inner circumference of the guide body 20.

A respective ball 24 and a respective spring 26 are inserted into each of these receptacles 23. In this case, the balls 24 are positioned at the radially inner end of the springs 26. The balls 24 and the latching depressions 19 in the latching bushing 18 are dimensioned in such a way that the balls 24 can engage in the latching depressions 19 to a specific extent when the receptacles 23 in the guide body 20 are positioned with corresponding alignment in relation to the latching depressions 19 in the latching bushing 18 (see FIGS. 3 and 4). In this case, the balls 24 are prestressed in the direction of the latching bushing 18 by the springs 26.

The ring-like or sleeve-like operator control element 28 is placed over the guide body 20. Whereas the operator control panel 10 (at least in the region of the rotary knob 12), the holding pin 14, the latching bushing 18 and the guide body 20 are preferably produced from an electrically non-conductive material, for example plastic, the operator control element 28 can be produced from an electrically conductive material, for example metal or can at least be provided with an electrically conductive coating.

Figure 3:
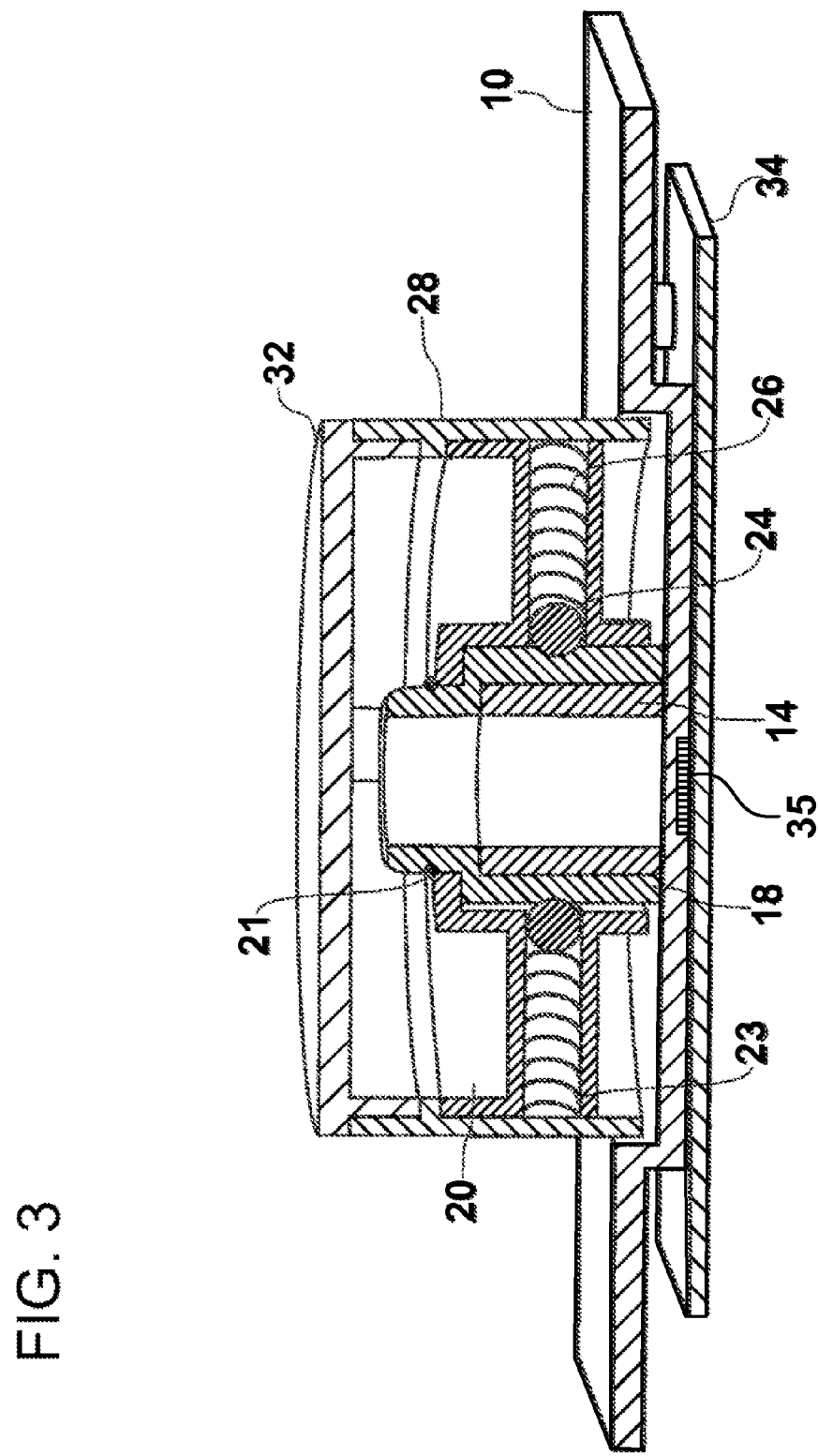
FIG. 3 is a sectional view of the rotary knob operator control apparatus of FIG. 1, which is taken along a section line B-B thereof, in the direction of the arrows.
Figure 4:
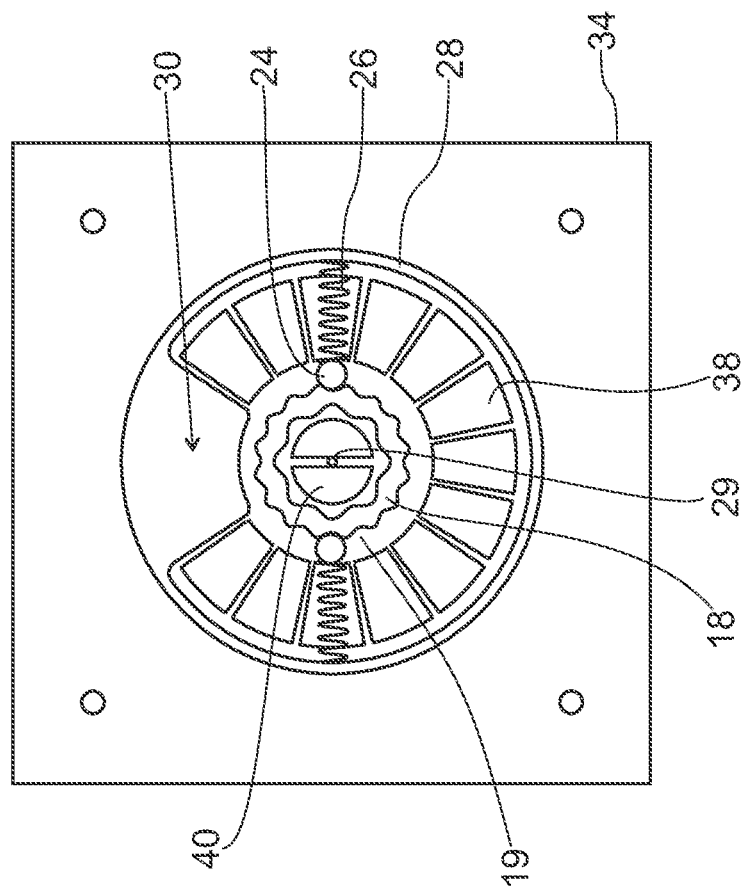
FIG. 4 is a plan view of a first electrode configuration of the rotary knob operator control apparatus of FIG. 1.
Figure 5:
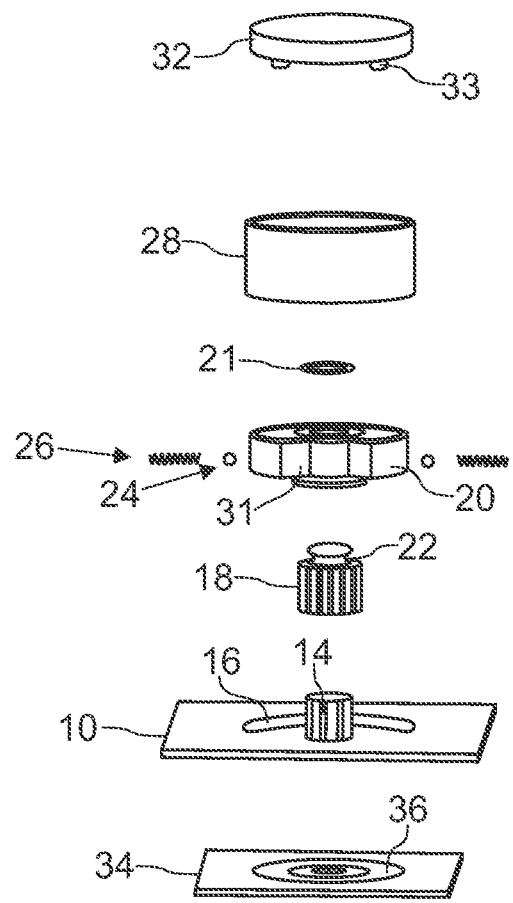
FIG. 5 is an exploded, perspective view of the rotary knob operator control apparatus of FIG. 1.
Figure 6:
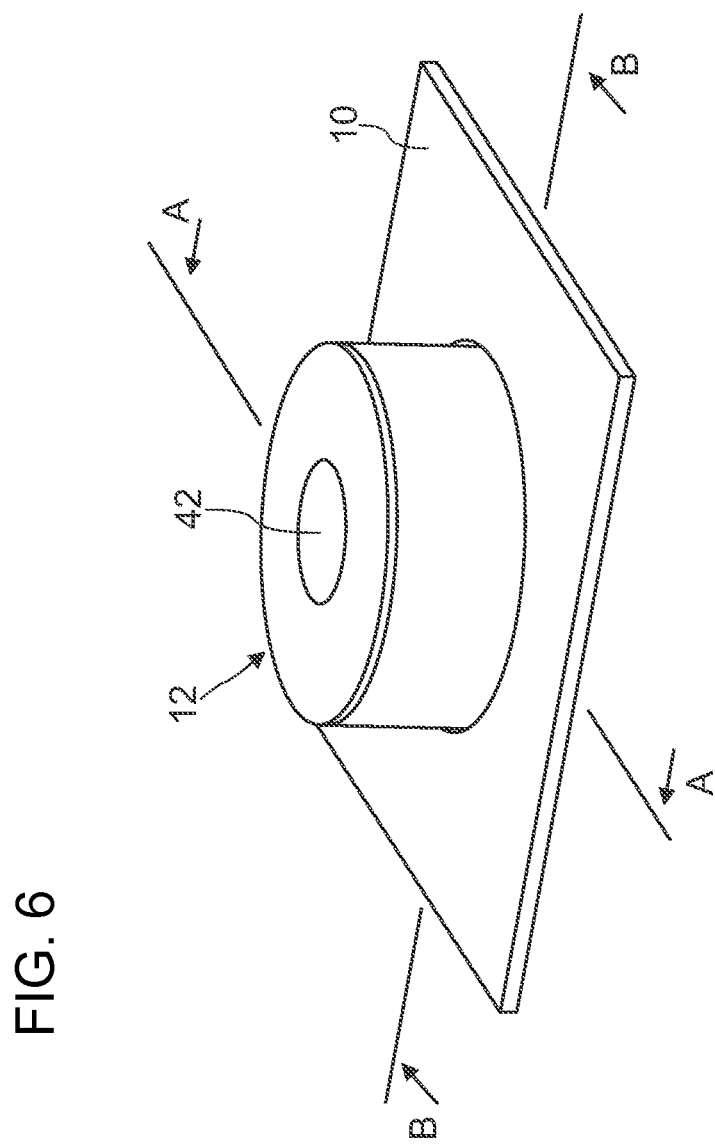
FIG. 6 is a perspective, plan view of a rotary knob operator control apparatus according to a second exemplary embodiment of the present invention.

The operator control element 28 has an inside diameter which corresponds approximately to the outside diameter of the guide body 20, and is connected to the guide body 20 (for example by press-fitting, latching, adhesive bonding, welding, screwing, etc) so as to rotate with it. As is shown in FIGS. 3 and 4, the springs 26 are supported in the receptacles 23 of the guide body 20 against the inner circumferential surface of the operator control element 28 and thereby press the balls 24 in the radial direction inwards against the latching bushing 18.

In addition, the outside diameter of the operator control element 28 is slightly smaller than the diameter of the depression 16 in the operator control panel 10. As a result, the operator control element 28 is routed or guided not only through the holding pin 14, but also through the depression 16, as it is rotated.

An electrode 30 is additionally formed integrally or in one piece on the annular operator control element 28. The electrode extends substantially radially inwards from the inner circumference of the operator control element 28. The shape of the electrode 30 is approximately wedge-like, in such a way that it tapers inwards in the radial direction. In addition, the electrode 30 extends radially inwards only to a predefined extent which lies clearly outside the outside diameter of the latching bushing 18 (see FIGS. 2 and 4). A corresponding recess 31 is formed in the guide body 20 in order to accommodate this electrode 30 on the operator control element 28 (see FIG. 5).

The electrode 30 is preferably provided in that end region of the operator control element 28 which faces the operator control panel 10 (see FIGS. 2 and 5), with the result that the electrode 30, which forms a second electrode configuration of the rotary knob operator control apparatus 12 according to the invention, is disposed close to the operator control panel 10.

While, as explained above, the entire operator control element 28 can be constructed or coated to be electrically conductive, it is also possible to construct only the electrode 30 of the operator control element 28 to be electrically conductive or to coat only the lower side of the electrode 30, which lower side faces the operator control panel 10, to be electrically conductive.

That end of the annular operator control element 28 which faces the user is closed by a cap 32. The cap is preferably produced from an electrically non-conductive material, for example plastic. In this exemplary embodiment, the cap 32 is placed firmly on the operator control element 28 by at least one latching peg 33 (alternatively also by, for example, press-fitting, latching, screwing, welding, adhesive bonding, etc).

A mounting board 34 is provided on that side of the operator control panel 10 which is averted or faces away from the user (at the bottom in the figures). The mounting board 34 is oriented substantially parallel to the operator control panel 10 and is preferably constructed as a printed circuit board.

A first electrode configuration 36 is provided on the mounting board 34 on that side of the mounting board which faces the operator control panel 10. As is shown in FIG. 4 in particular, this first electrode configuration 36 has a large number (in this exemplary embodiment sixteen) of electrode segments 38 which are disposed in a circle and each of which extend substantially in the radial direction. In this case, the electrode configuration 36 is oriented radially to the rotation axis 29 of the operator control element 28. The shape and dimensions of the electrode segments 38 correspond substantially to those of the electrode 30 on the operator control element 28.

In addition, the mounting board 34 is disposed as close as possible behind the operator control panel 10, with the result that the distance between the first electrode configuration 36 and the operator control panel 10 is also as small as possible. Therefore, the distance between the electrode 30 of the operator control element 28 and the electrode configuration 36 on the mounting board 34 is also selected to be as small as possible overall, so that the operator control panel 10 between them serves as a dielectric of a capacitive sensor configuration which is formed in this way.

The number of latching depressions 19 in the latching bushing 18 corresponds to the number of electrode segments 38 of the first electrode configuration 36. In addition, the latching depressions 19 are provided in the same angular positions as the electrode segments 38.

The latching device of the invention, which is formed by the latching bushing 18, the guide body 20, the balls 24 and the springs 26, latches the operator control element 28 in predefined rotary positions relative to the operator control panel 10. In these predefined rotary positions, the electrode 30 on the operator control element 28 is in each case positioned on the mounting board 34 substantially congruently to an electrode segment 38 or preferably to a plurality (in this case three) of electrode segments 38 of the first electrode configuration 36.

Depending on the configuration of the evaluation circuit (hardware and/or software), it is possible to detect the absolute rotary position of the operator control element 28, the rotation direction of the operator control element 28 and/or the relative rotary movement of the operator control element 28 and to forward these/this to a control system of the domestic appliance.

In an alternative exemplary embodiment, some of the latching depressions 19 in the latching bushing 18 can also be omitted. For example, only every second or every third latching depression 19 may be present. In this case, the same first electrode configuration 36 without modifications can be used for various rotary knobs 12 with different numbers of predefined rotary positions.

As described above, the guide body 20 is held on the holding pin 14 or the latching bushing 18 in the axial direction. In this case, this holding device is preferably constructed to be detachable. Since the operator control element 28 is fixedly connected to the guide body 20, the operator control element can be withdrawn from the holding pin together with the guide body 20 if required, in order, for example, to thoroughly clean the operator control element 28 and the operator control panel 10. When the operator control element 28 is mounted on the holding pin 14, it is necessary to ensure that the springs 26 and the balls 24 are located in the receptacles 23 of the guide body 20.

In an alternative embodiment, the latching device can also contain structures other than the balls 24 which are prestressed by the helical springs 26. For example, the process of latching in predefined rotary positions can also be realized, for example, by suitable leaf springs.

A second exemplary embodiment of a rotary knob operator control apparatus according to the invention will now be explained in greater detail with reference to FIGS. 6 to 9. In the figures, identical and corresponding components are identified with the same reference numerals as in the above-described first exemplary embodiment.

In comparison to the rotary knob operator control apparatus illustrated in FIGS. 1 to 5, the rotary knob operator control apparatus 12 of this exemplary embodiment additionally has an integrated central pushbutton 42.

An additional function can be controlled by using a pushbutton 42 of this kind. For example, a washing program of the washing machine can be set by turning the operator control element 28 of the rotary knob 12, and this washing program can then be started by pressing the pushbutton 42.

The cap 32 has a central aperture 44 for the purpose of integrating the pushbutton 42 in the rotary knob 12. A tappet 46 is inserted into this aperture 44. The tappet extends substantially coaxially to the rotation axis 29 of the operator control element 28 in the direction of the operator control panel 10.

In this exemplary embodiment, the tappet 46 is additionally constructed with an integral or one piece cap which, when the pushbutton 42 is not operated, is substantially in alignment with the cap 32 of the operator control element 28 and closes the aperture 44 in the cap 32. The tappet 46 can be produced from an electrically conductive material, for example metal, or from an electrically non-conductive material, for example plastic.

A spring 48 is pushed over the tappet 46. The tappet 46 is additionally provided with a disc-like electrode 50 at its end which faces the operator control panel 10. At least this electrode 50 of the pushbutton 42 is constructed to be electrically conductive or is coated so as to be electrically conductive at least on its lower side which faces the operator control panel 10.

Figure 7:
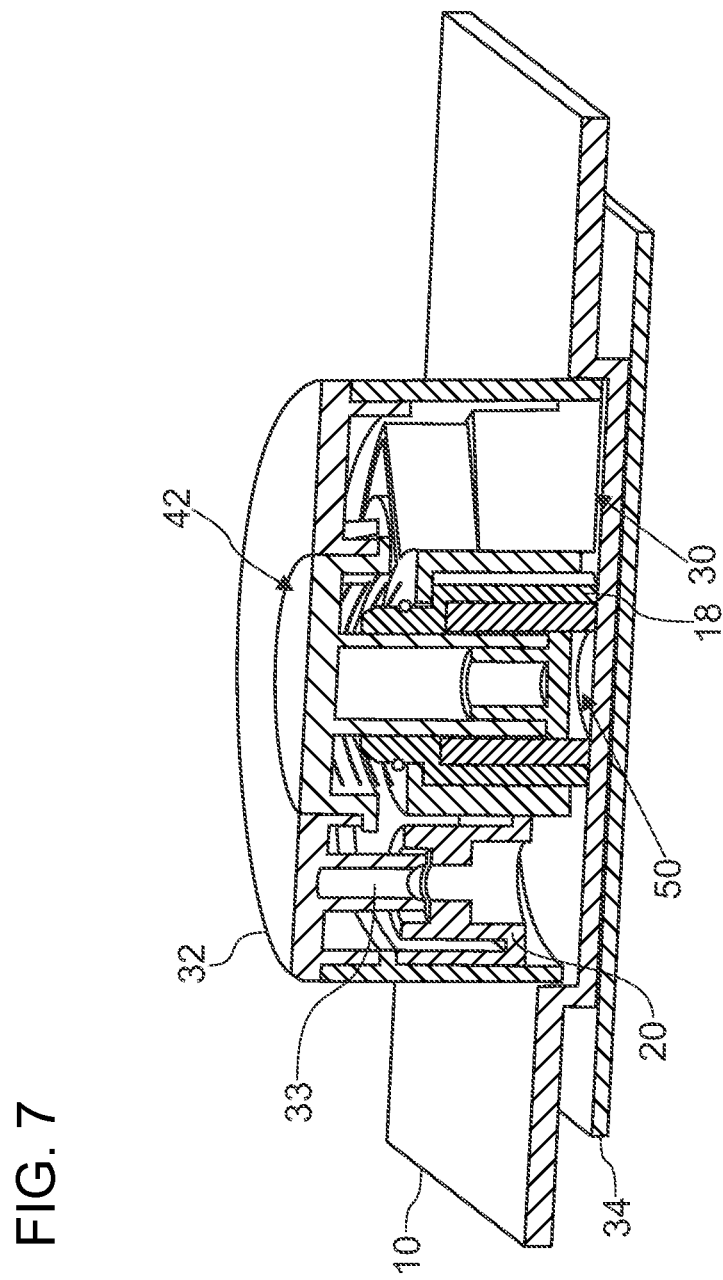
FIG. 7 is a sectional view of the rotary knob operator control apparatus of FIG. 6, which is taken along a section line A-A thereof, in the direction of the arrows.
Figure 8:
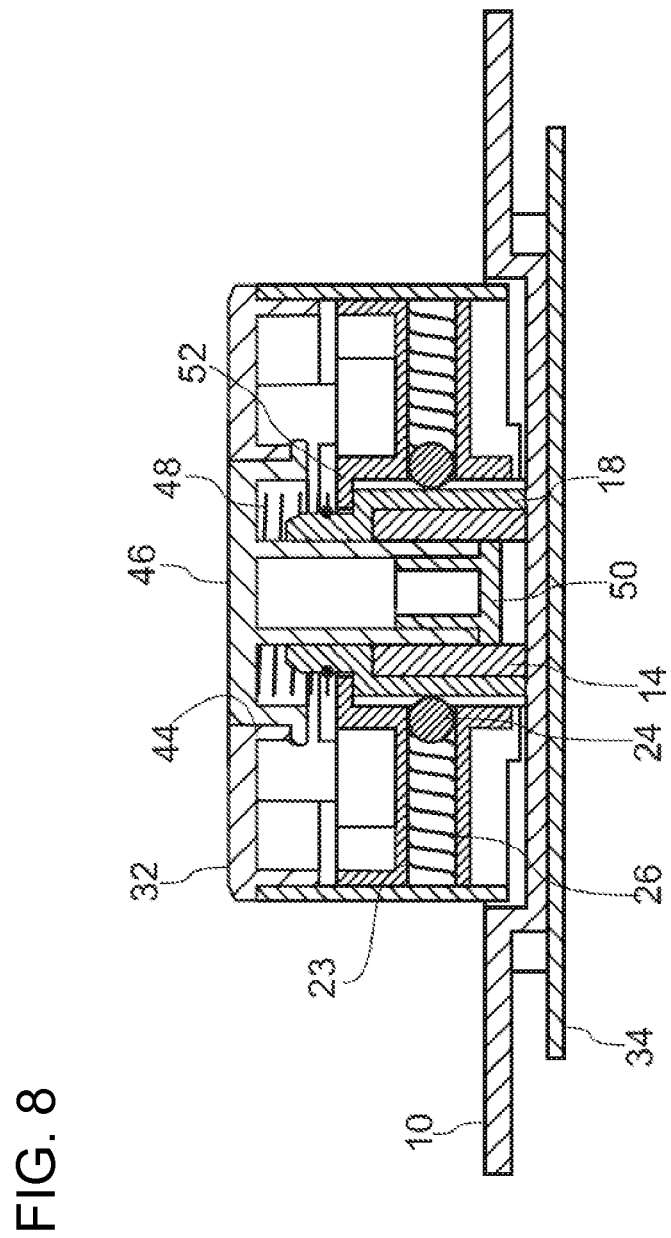
FIG. 8 is a sectional view of the rotary knob operator control apparatus of FIG. 6, which is taken along a section line B-B thereof, in the direction of the arrows.

As is illustrated in FIGS. 7 and 8, the spring 48 is supported on the cap of the tappet 46 at one end and on a supporting surface 52 on the guide body 20 at the other end. In this way, the tappet 46 is prestressed in the direction of the cap 32 of the operator control element 28, with the result that the electrode 50 on the tappet 46 is also prestressed in the direction away from the operator control panel 10.

Figure 9:
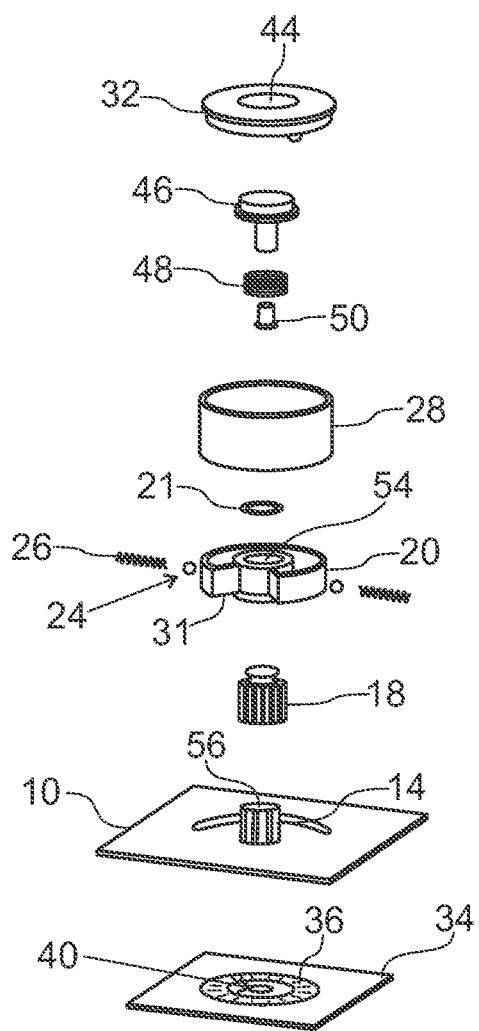
FIG. 9 is an exploded, perspective view of the rotary knob operator control apparatus of FIG. 6.

As is illustrated in FIGS. 7 to 9, a central aperture 54 is provided in the guide body 20 and a central aperture 56 is provided in the holding pin 14. The tappet 46 of the pushbutton 42 projects into the apertures 54, 56 coaxially to the rotation axis 29 of the operator control element 28.

As is illustrated in FIG. 9, the first electrode configuration 36 on the mounting board 34 also has a central electrode 40 in addition to the electrode segments 38. This central electrode 40 is positioned coaxially to the rotation axis 29 of the operator control element 28 and therefore also coaxially to the tappet 46 of the pushbutton 42. As can further be seen in FIG. 9, the central electrode 40 has a multipartite construction, in this embodiment in the form of two substantially semicircular electrode segments which are spaced apart from one another.

This central electrode 40 of the first electrode configuration 36 on the mounting board 34, together with the disc electrode 50 on the tappet 46 and the operator control panel 10 as a dielectric between them, forms a capacitive sensor configuration. When the pushbutton 42 is not operated, the tappet 46 is prestressed in the direction away from the operator control panel 10 by the spring 48, with the result that an air gap is produced between the operator control panel 10 and the disc electrode 50 of the pushbutton 42. When the pushbutton 42 is operated, the user pushes the tappet 46 into the rotary knob 12 against the force of the spring 48 and in this way moves the disc electrode 50 in the direction of the operator control panel 10. The capacitance value of the sensor configuration is changed in this way, and it is possible for this change to be detected and evaluated by the evaluation circuit which is connected to the first electrode configuration. A change in the capacitance value, which change is caused solely by the user touching the pushbutton 42, can already be detected and evaluated too, depending on the configuration of the evaluation circuit.

The pushbutton 42 or its tappet 46 can be constructed either so as to rotate with the operator control element 28 or so as to rotate with the holding pin 14. In other words, the pushbutton 42 can be constructed either to rotate together with the operator control element 28 of the rotary knob 12 or to be stationary.

The other features of this rotary knob operator control apparatus 12 correspond to those of the above-described first exemplary embodiment. Therefore, repetition of a detailed explanation of these further features is dispensed with at this point.

The rotary knob operator control apparatus 12 can additionally be provided with a lighting system or backlighting system in variants of the above-described exemplary embodiments. To this end, at least one light source 35, for example in the form of a light-emitting diode or a light-emitting diode group, is additionally disposed on the mounting board 34. The operator control panel 10 is constructed to be at least partially transparent in the region of the rotary knob 12, with the result that the light which is emitted by the light source 35 can pass through the operator control panel 10 without an aperture having to be provided in operator control panel. The operator control element is likewise constructed to be at least partially transparent, with the result that the light which is emitted by the light source 35 and runs through the operator control panel 10 can emerge from the operator control element 28 or the cap 32 of the operator control element. As an alternative or in addition, the operator control element 28 contains at least one light guide element. By way of example, an operating state of the domestic appliance or a readiness to operate of the rotary knob 12 can be indicated to the user by backlighting the rotary knob 12 in this way.

Whereas the latching device 18-26 is constructed in such a way that the operator control element 28 is latched in predefined rotary positions in the radial direction between the operator control element 28 and the central holding pin 14 or the latching bushing 16, which is plug-mounted onto the holding pin, in the above-described exemplary embodiments, latching in the axial direction, that is to say in a direction parallel to the rotation axis 29 of the operator control element 28, is also feasible. Therefore, the balls 24 which are prestressed with the springs 26 can also be disposed between the lower side of the operator control element 28 or of the guide body 20, which lower side faces the operator control panel 10, and the operator control panel 10 itself and can be prestressed in the direction of the operator control panel 10. By way of example, corresponding latching depressions for the balls 24 can be formed in the depression 16 in the operator control panel 10.

A domestic appliance can be equipped with one or more rotary knob operator control apparatuses 12 of the invention. The first electrode configurations 36 of these rotary knob operator control apparatuses 12 are then preferably disposed on a common mounting board 34 and possibly also coupled to a common evaluation circuit.

If the domestic appliance contains further touch-sensitive or proximity-sensitive operator control elements, they preferably likewise have capacitive sensor configurations, with the result that there is a uniform input and evaluation concept. The electrodes of these further operator control elements are then preferably likewise disposed on the mounting board 34 and possibly also coupled to a common evaluation circuit.

The invention claimed is:

1. A rotary knob operator control apparatus, comprising:
   an operator control panel having a side facing toward a user and a side facing away from the user, said operator control panel defining a rotation axis running substantially perpendicular to said operator control panel;
   a mounting board disposed on said side of said operator control panel facing away from the user;
   a first electrode configuration disposed on said mounting board;
   a substantially annular operator control element disposed on said side of said operator control panel facing toward the user, said operator control element being rotatable about said rotation axis;
   a second electrode configuration disposed on said operator control element;
   a holding device configured to hold said operator control element on said operator control panel, said holding device including a holding pin integrally formed on or fastened to said operator control panel side facing toward the user without an aperture through said operator control panel behind said operator control element; and
   a latching device latching said operator control element relative to said operator control panel in a plurality of predefined rotary positions, wherein said latching device comprises an elastic member on an inner circumferential surface of said operator control element.

2. The rotary knob operator control apparatus according to claim 1, wherein said latching device performs the latching of said operator control element relative to said operator control panel in a substantially radial manner or in a substantially axial manner.

3. The rotary knob operator control apparatus according to claim 1, wherein:
   said first electrode configuration has a central electrode on said mounting board; and
   a pushbutton is disposed in said operator control element substantially coaxially to said rotation axis about which said operator control element is rotatable;
   said pushbutton has a side facing toward said operator control panel, is configured to be moved substantially in a direction of said rotation axis about which said operator control element is rotatable and has at least one electrode on said side of said pushbutton facing said operator control panel.

4. The rotary knob operator control apparatus according to claim 1, which further comprises:
   at least one light source disposed on said mounting board;
   said operator control panel being constructed to be at least partially transparent; and
   said operator control element being constructed to be at least partially transparent and/or contain at least one light guide element.

5. The rotary knob operator control apparatus according to claim 1, wherein said first electrode configuration has a plurality of electrode segments on said mounting board, and said plurality of electrode segments are disposed substantially coaxially to said rotation axis about which said operator control element is rotatable.

6. The rotary knob operator control apparatus according to claim 1, wherein said second electrode configuration has at least one electrode on said operator control element, and said at least one electrode extends substantially radially to said rotation axis about which said operator control element is rotatable.

7. The rotary knob operator control apparatus according to claim 1, wherein said holding device is configured to hold said operator control element in a detachable manner on said operator control panel.

8. The rotary knob operator control apparatus according to claim 1, wherein the rotary knob operator control apparatus is a control apparatus of an electrical domestic appliance.

9. An electrical domestic appliance, comprising at least one rotary knob operator control apparatus according to claim 1.

10. The electrical domestic appliance according to claim 9, which further comprises at least one touch-sensitive or proximity-sensitive operator control element provided with a capacitive sensor configuration and an electrode, said electrode of said capacitive sensor configuration being disposed on said mounting board along with said first electrode configuration of the at least one rotary knob operator control apparatus.

11. The rotary knob operator control apparatus according to claim 1, wherein said first electrode configuration and said second electrode configuration form a capacitive sensor configuration.

12. The rotary knob operator control apparatus according to claim 11, wherein said operator control panel between said first electrode configuration and said second electrode configuration is substantially electrically insulating.

* * * * *